United States Patent
Mazzocco et al.

(10) Patent No.: US 10,023,954 B2
(45) Date of Patent: Jul. 17, 2018

(54) SLIT VALVE APPARATUS, SYSTEMS, AND METHODS

(75) Inventors: John J. Mazzocco, San Jose, CA (US); Dale Robert Du Bois, Los Gatos, CA (US); Juan Carlos Rocha-Alvarez, San Carlos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 906 days.

(21) Appl. No.: 13/608,389

(22) Filed: Sep. 10, 2012

(65) Prior Publication Data

US 2013/0068391 A1  Mar. 21, 2013

Related U.S. Application Data

(60) Provisional application No. 61/535,319, filed on Sep. 15, 2011.

(51) Int. Cl.
| | |
|---|---|
| C23C 16/44 | (2006.01) |
| H01L 21/67 | (2006.01) |
| C23C 14/56 | (2006.01) |
| C23C 16/54 | (2006.01) |
| F16K 51/02 | (2006.01) |
| F16K 3/02 | (2006.01) |
| F16K 3/16 | (2006.01) |
| F16K 3/22 | (2006.01) |
| F16K 3/314 | (2006.01) |

(52) U.S. Cl.
CPC ............ *C23C 14/56* (2013.01); *C23C 16/54* (2013.01); *F16K 3/0218* (2013.01); *F16K 3/0254* (2013.01); *F16K 3/16* (2013.01); *F16K 3/22* (2013.01); *F16K 3/314* (2013.01); *F16K 51/02* (2013.01)

(58) Field of Classification Search
CPC ...... F16K 51/02; F16K 3/0254; F16K 3/0218; F16K 3/314; H01L 21/67376; H01L 21/67196; H01L 21/67184–21/67201
USPC .................. 118/715–733; 156/345.1–345.55
See application file for complete search history.

(56) References Cited

U.S. PATENT DOCUMENTS

| | | | | |
|---|---|---|---|---|
| 4,883,002 | A * | 11/1989 | Schuster | F27D 1/1858 110/173 R |
| 5,193,998 | A * | 3/1993 | Hack et al. | 432/250 |
| 5,231,881 | A * | 8/1993 | Lew | G01L 9/0013 73/704 |
| 6,347,918 | B1 | 2/2002 | Blahnik | |
| 6,494,670 | B2 * | 12/2002 | Kroeker | 414/805 |
| 6,561,484 | B2 * | 5/2003 | Nakagawa et al. | 251/175 |
| 6,729,824 | B2 | 5/2004 | Lei et al. | |
| 6,764,265 | B2 | 7/2004 | Kunze et al. | |
| 6,800,172 | B2 | 10/2004 | Carpenter et al. | |
| 6,913,243 | B1 * | 7/2005 | Tomasch | 251/167 |
| 7,007,919 | B2 | 3/2006 | Blonigan et al. | |

(Continued)

FOREIGN PATENT DOCUMENTS

EP   0 735 574   10/1996

*Primary Examiner* — Gordon Baldwin
*Assistant Examiner* — Charlee J C Bennett
(74) *Attorney, Agent, or Firm* — Dugan & Dugan, PC

(57) ABSTRACT

Slit valve apparatuses are described. In one aspect, a slit valve apparatus is disclosed having a gate with at least one sealing surface, a blocker element, and a connector member that structurally connects the gate and the blocker element. Systems and methods including the slit valve apparatus are also disclosed, as are numerous other aspects.

13 Claims, 10 Drawing Sheets

(56) References Cited

U.S. PATENT DOCUMENTS

| | | |
|---|---|---|
| 7,159,846 B2 | 1/2007 | Aggarwal et al. |
| 7,658,200 B2 | 2/2010 | Choi et al. |
| 8,064,070 B2 | 11/2011 | Schauer |
| 2001/0041122 A1* | 11/2001 | Kroeker ........................ 414/217 |
| 2005/0051093 A1* | 3/2005 | Makino ............. H01L 21/67017 |
| | | 118/719 |
| 2006/0263178 A1* | 11/2006 | Weaver ............. H01L 21/67772 |
| | | 414/217.1 |
| 2009/0108544 A1 | 4/2009 | Sico et al. |
| 2014/0027968 A1* | 1/2014 | Krayvitz (Krivts) |
| | | et al. ........................... 269/287 |

\* cited by examiner

SLIT VALVE APPARATUS, SYSTEMS, AND METHODS

RELATED APPLICATIONS

The present application claims priority from U.S. Provisional Patent Application Ser. No. 61/535,319, filed Sep. 15, 2011, entitled "SLIT VALVE APPARATUS, SYSTEMS, AND METHODS" which is hereby incorporated herein by reference in its entirety for all purposes.

FIELD

The present invention relates to electronic device manufacturing, and more specifically to slit valve apparatus, systems, and methods.

BACKGROUND

Conventional electronic device manufacturing systems may include process chambers and/or load lock chambers. Each of the chambers may be included in cluster tools where a plurality of process chambers may be distributed about a transfer chamber, for example. These tools may employ a transfer robot that may be housed within the transfer chamber to transport substrates between the various process chambers and load lock chambers. Conventionally, a slit valve apparatus is provided between the transfer chamber and the process chamber or load lock chamber. Generally, there is one slit valve apparatus for each chamber. An end effector (e.g., blade) of the transfer robot passes by the slit valve apparatus to place or extract a substrate (e.g., silicon wafer) into the chamber. The slit valve(s) apparatus then may close to seal the chamber once the substrate has been inserted in the chamber. However, conventional slit valve apparatus may suffer from many problems that may affect the quality of the process taking place in the chamber and or longevity of the seals of the slit valve gates.

Accordingly, improved slit valve apparatus, systems and methods are desired.

SUMMARY

In one aspect, a slit valve apparatus is provided. The slit valve apparatus includes a gate having at least one sealing surface; a blocker element; and one or more connector members structurally connecting the gate and the blocker element.

In another aspect, an electronic device processing system is provided. The system includes a chamber having an opening, a slit valve apparatus arranged to seal the opening at a first location, wherein the slit valve apparatus includes a gate having at least one sealing surface adapted to seal at the first location, a blocker element, and one or more connector members structurally connecting the gate and the blocker element, the blocker element engaging with and blocking the opening at a second location spaced from the first location.

In another aspect, a method of transporting a substrate is provided. The method includes providing a chamber having an opening adapted to receive a substrate and a chamber wall, sealing the opening at a first location with a gate of a slit valve apparatus, and blocking the opening at a second location with a blocking element received proximate to the chamber wall.

Numerous other features are provided in accordance with these and other aspects of the invention. Other features and aspects of the present invention will become more fully apparent from the following detailed description, the appended claims and the accompanying drawings.

DETAILED DESCRIPTION

Electronic device manufacturing may require slit valve apparatus to be provided between various chambers to isolate environments and/or to provide a vacuum in one chamber or differential vacuum between chambers. Prior art slit valve apparatuses may cause problems within the chamber such as relatively uneven heat distribution, relatively uneven gas flow patterns, relatively uneven deposition, relatively non-uniform plasma, relatively non-uniform etching, relatively short seal life, and/or may require the use of very expensive seals. To solve one or more of these problems, the present invention provides an improved slit valve apparatus. System and method aspects are also disclosed.

Accordingly, in one aspect, an improved slit valve apparatus includes a gate having an interconnected blocker element that interfaces with an opening into a chamber. The blocker element functions to at least partially block the opening at a position proximate to the chamber so that a heat path to the seals of the gate is blocked. Similarly, the blocking element, in some embodiments, may improve the heat pattern uniformity, flow uniformity, plasma uniformity, and/or deposition uniformity within the chamber. For example, a frontal surface of the blocker element may be made to substantially conform to a surface profile of the chamber. In one aspect, one or more connector members may structurally connect the gate and the blocker element. A space may be provided between the gate and the blocker element and function as a thermal break to minimize a thermal path between the gate and the blocker element.

In another aspect, an electronic device processing system is provided. The system includes a chamber (e.g., a process chamber or load lock chamber) having an opening, and a slit valve apparatus arranged to seal the opening at a first location. The slit valve apparatus includes a gate having at least one sealing surface (e.g., a flexible seal) adapted to seal at the first location, a blocker element, and a connector member structurally connecting the gate and the blocker element. The blocker element engages with, and blocks, the opening at a second location spaced from the first location. The spaced second location may be located directly proximate to the chamber.

Further details of example embodiments of various aspects of the invention, including method aspects, are described with reference to FIGS. 1-7 herein.

Figure 1:
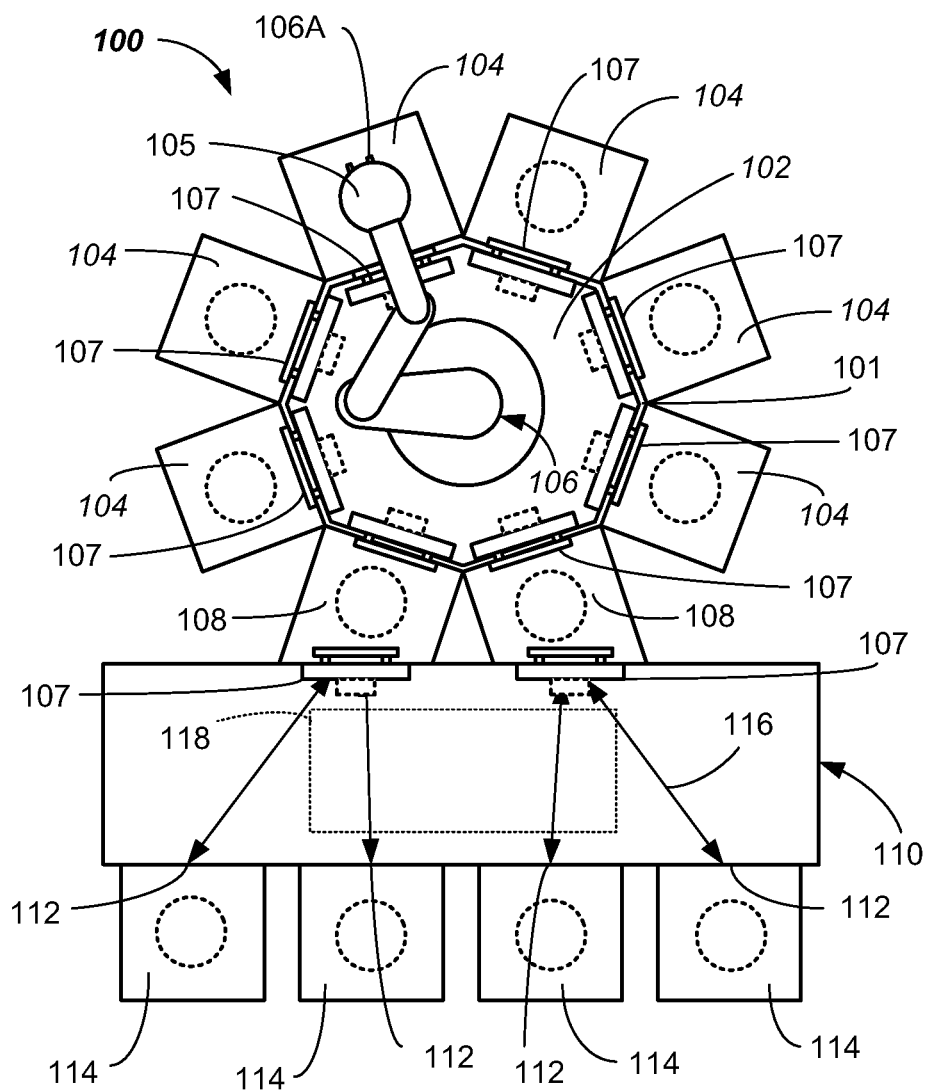
FIG. 1 is a schematic top view of a substrate processing system including a robot apparatus located in a transfer chamber and adapted to transport substrates through slit valve apparatus according to embodiments.

FIG. 1 illustrates a top view schematic diagram of an example embodiment of an electronic device processing system 100 according to the present invention. The electronic device processing system 100 may be adapted to process substrates (e.g., silicon-containing wafers, plates, or the like) by imparting one or more processes thereto, such as degassing, cleaning or pre-cleaning, deposition such as chemical vapor deposition (CVD), physical vapor deposition (PVD), or atomic layer deposition, coating, oxidation, nitration, etching, polishing, lithography, or the like. The depicted electronic device processing system 100 includes a housing 101 including a transfer chamber 102 formed therein. The transfer chamber 102 includes top (not shown for clarity), bottom and side walls and may be maintained at a vacuum, for example. In the depicted embodiment, a robot apparatus 106 is received in the transfer chamber 102 and is adapted to be operable therein to service various chambers (e.g., one or more process chambers 104 and/or one or more load lock chambers 108). "Service" as used herein means to move a substrate into or out of a chamber, or both.

The robot apparatus 106 may be adapted to pick or place substrates 105 (sometimes referred to as a "wafer" or "semiconductor wafer") mounted on an end effector 106A (sometimes referred to as a "blade") of the robot apparatus 106 to or from a destination through the inventive slit valve apparatus 107. However, the present invention may be utilized with any type of substrate. The inventive slit valve apparatus 107 and its operation are further described with reference to FIGS. 2A-7 herein.

In the depicted embodiment of FIG. 1, the robot apparatus 106 may be any suitable multi-link robot that has sufficient mobility to transfer a substrate 105 between the various chambers 104 and/or load lock chambers 108. The load lock chambers 108 may be adapted to interface with a factory interface 110 that may receive substrates 105 from substrate carriers 114 such as Front Opening Unified Pods (FOUPs) docked at load ports 112. Another robot 118 (shown dotted) may be used to transfer substrates 105 between the substrate carriers 114 and the load lock chambers 108 as shown by arrows 116 (only one labeled). Transfers may be carried out in any sequence or order.

Now referring in more detail to FIGS. 2A-2D, an embodiment of a slit valve apparatus 107 is described in more detail. The slit valve apparatus 107 includes a gate 220 having at least one sealing surface 222, a blocker element 224, and one or more connector members 226 structurally connecting the gate 220 to the blocker element 224. The sealing surface may be a bonded seal extending around a periphery of the gate 220, for example. In one embodiment, the one or more connector members 226 function to couple to the gate 220 at a position offset from a physical center of the gate 220. Likewise, the one or more connector members 226 may couple to the blocker element 224 at a position offset from a physical center of the blocker element 224. For example, in the depicted embodiment, the one or more connector members 226 may comprise one or more rods. The one or more connector members 226 may be connected to the gate 220 and blocker member 224 at a top thereof by any suitable means, such as mechanical fasteners. Furthermore, the blocker member 224 and the one or more connector members 226 may be integrally formed. Moreover, in some embodiments, the gate 220 and the one or more connector members 226 may be an integrally formed member. Furthermore, in other embodiments, the gate 220, the blocking member 224, and the one or more connector members 226 may be integrally formed. The spacing of the blocking element 224 from the gate 220 by the connector members forms a space 223 between the blocking element 224 and the gate 220 that functions as a thermal break. The thermal break limits and minimizes heat transfer to the gate 220, and thus limits and minimizes heat exposure to the sealing surface 222.

In some embodiments, the one or more connector members 226 may have a total cross sectional area that is less than a frontal surface 228 of the blocker element 224. In some embodiments, the total cross sectional area is less than about 25% of a frontal area of a frontal surface 228 of the blocker element 224. In this manner, the blocker element 224 is not only spaced from the gate 220, but the reduced conduction area contributes to the aforementioned thermal break between the two. In some embodiments, the one or more connecting members 226 may comprise an insulator material or a material with relatively low thermal conductivity, such as a ceramic. Materials with thermal conductivities of less than 20 W/mK, or even less than 10 W/mK may be used. The frontal surface 228 is a surface exposed to the chamber 104 when the slit valve apparatus 107 is actuated into a closed configuration.

Figure 2A:
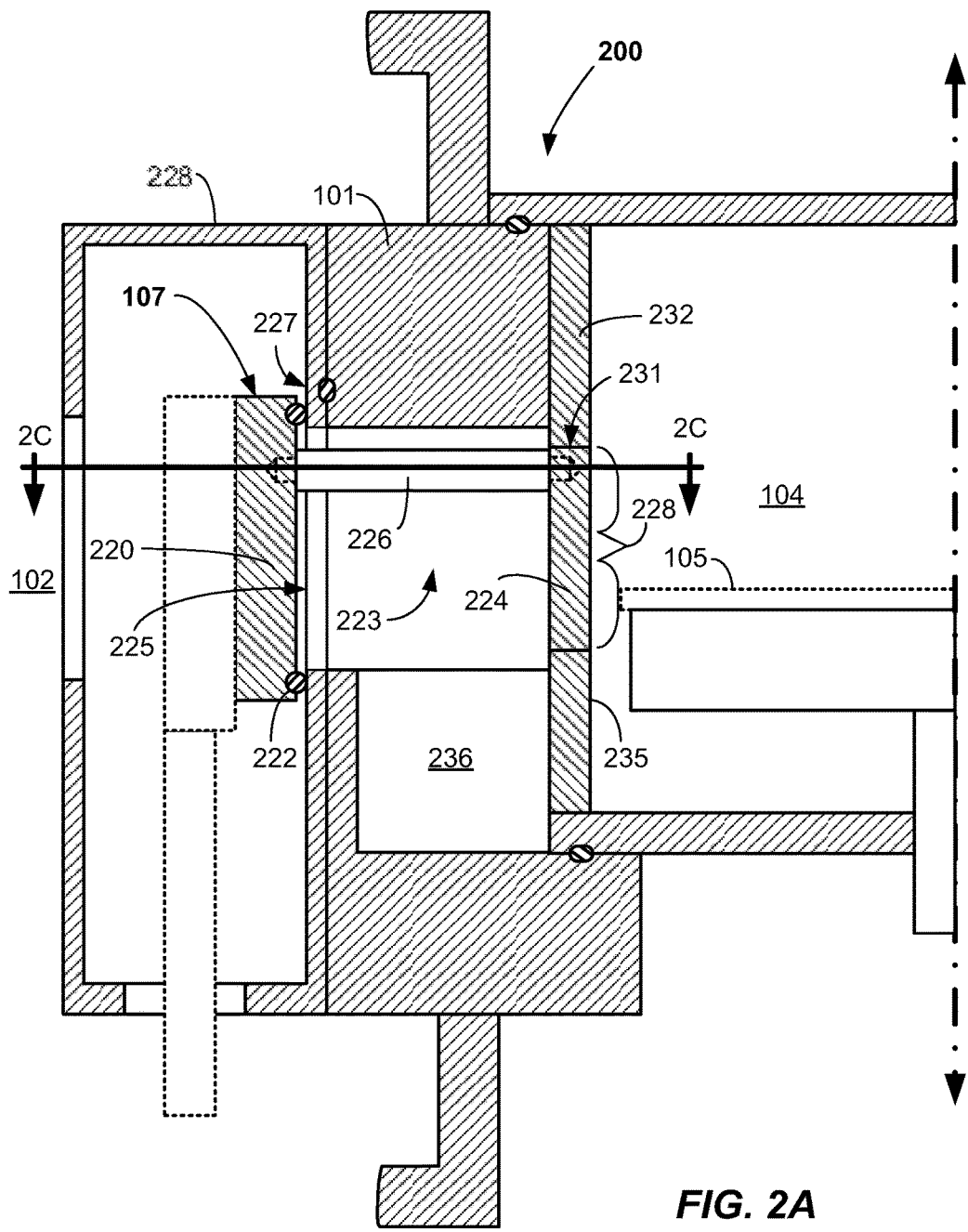
FIG. 2A is a cross-sectioned side view of an embodiment of slit valve apparatus included in a substrate processing system and shown in a closed configuration according to embodiments.
Figure 2B:
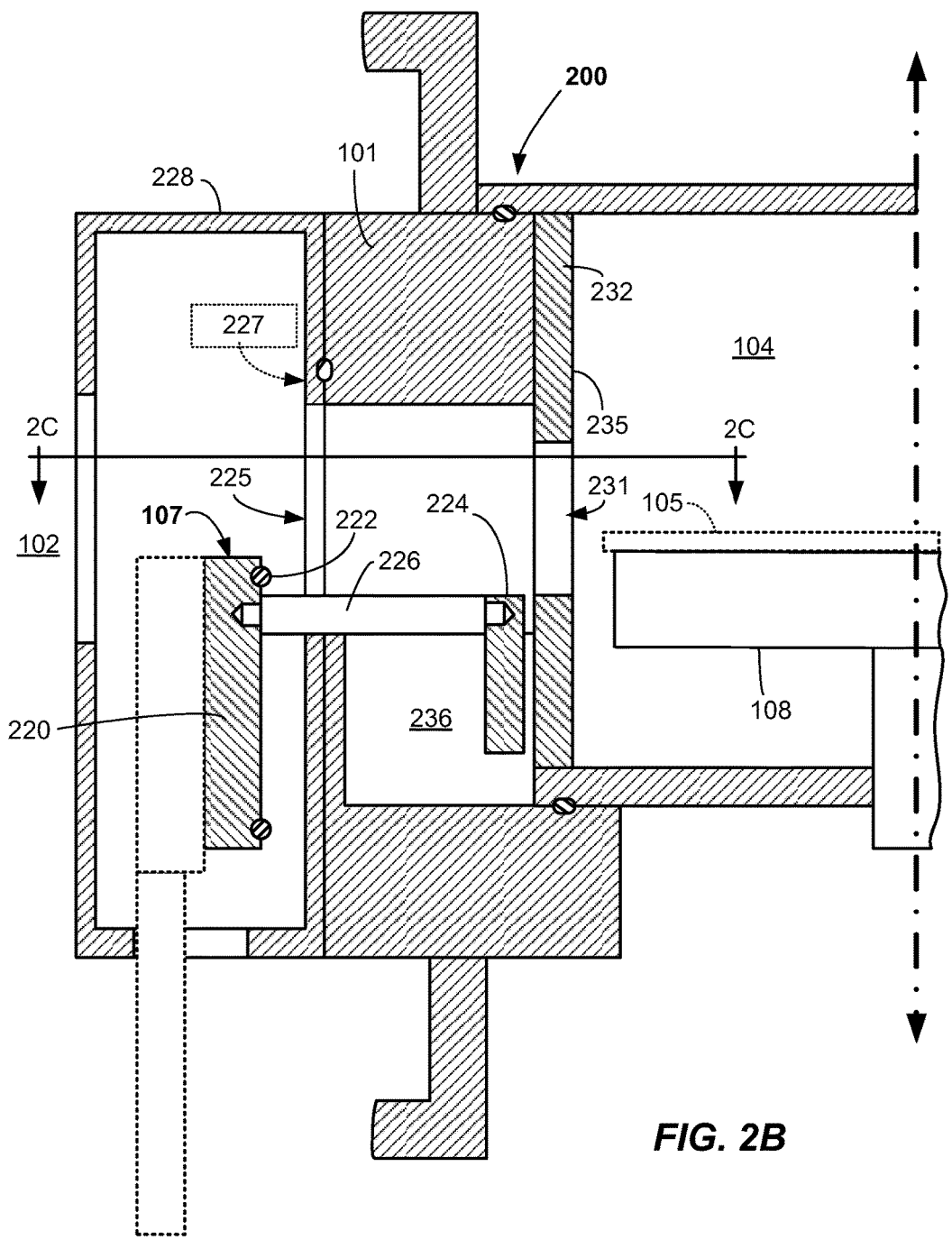
FIG. 2B is a cross-sectioned side view of the slit valve apparatus of FIG. 2A shown in an opened configuration.
Figure 2C:
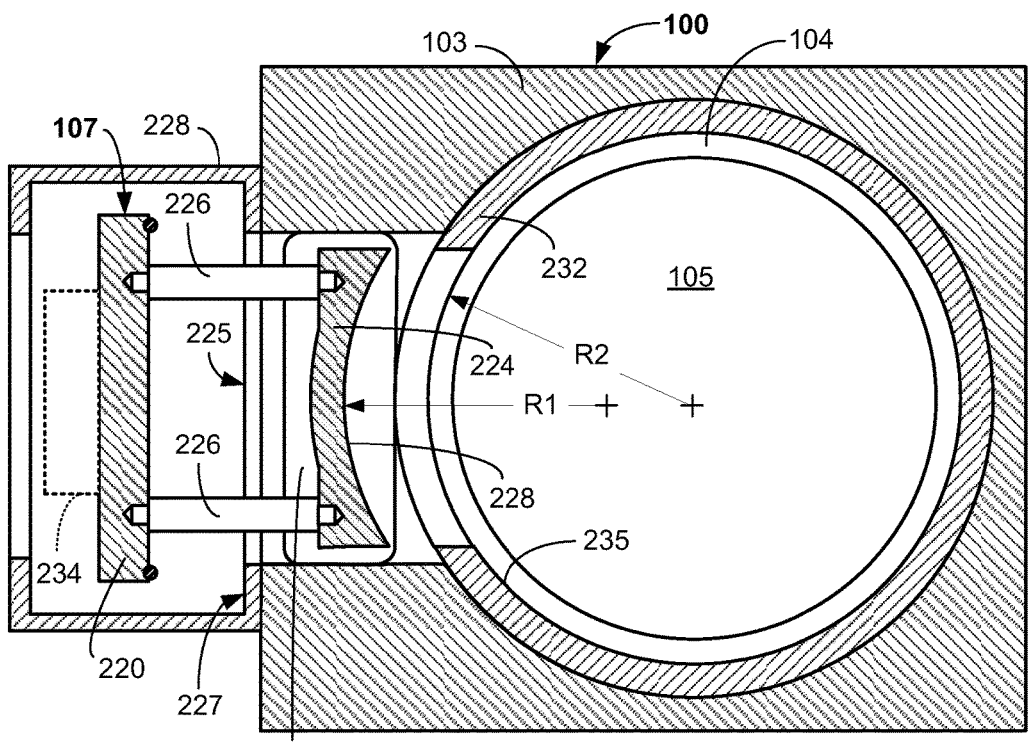
FIG. 2C is a cross-sectioned top view of an embodiment of slit valve apparatus of FIG. 2A taken along section line 2C-2C of FIG. 2B.
Figure 2D:
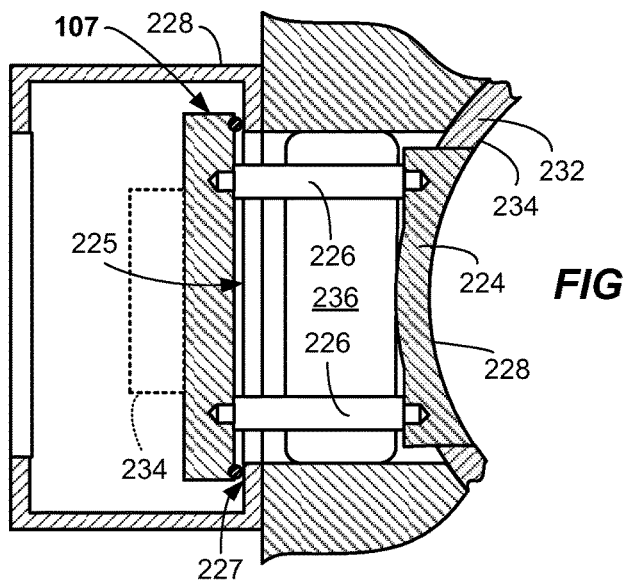
FIG. 2D is a partial cross-sectioned top view of an embodiment of slit valve apparatus of FIG. 2C shown in a closed configuration.

As shown in FIG. 2C, the blocker element 224 may include a curved frontal surface 228 in some embodiments. In particular, the curved frontal surface 228 on the blocker element 224 may include a radius of curvature R1 that substantially matches a radius of curvature R2 of the chamber 104 that the blocker element 224 is adapted to interface with. In this way, a frontal surface 228 on the blocking element 224 has a surface profile that is substantially the same as a surface profile of the wall 235 of the chamber 104.

Again referring to FIGS. 2A-2C, an electronic device processing system 200 is shown in various views. The system 200 includes a chamber 104, which in the depicted embodiment is a process chamber. The chamber 104 includes an opening 225 through which substrates 105 are passed to bring them into and out of the chamber 104 such as by the action of any suitable robot apparatus (e.g., robot apparatus 106). The system 200 further includes the slit valve apparatus 107 as described herein being arranged and configured to seal around the opening 225 at a first location 227. The first location 227 may be a surface of the housing 101, or a surface of a slit valve cover 228. The slit valve apparatus 107 includes, as described above, a gate 220 that may have at least one sealing surface (e.g., seal 222) adapted to seal at the first location 227, a blocker element 224, and one or more connector members 226 structurally connecting the gate 220 and the blocker element 224. In the depicted embodiment, the sealing surface includes a seal 222 such as a bonded elastomer seal, which may include a racetrack shape expanding around the sealing face of the gate 220 near a radial periphery of the gate 220. The blocker element 224 engages with, and blocks the opening 225 at a second location 231 that is spaced from the first location 227. For example, the second location 231 may be at an opening directly adjacent and located directly proximate to the chamber 104.

In FIG. 2A, the blocker element 224 is shown engaging and interfacing with a liner element 232 of the chamber 104. The slit valve apparatus 107 may be moved by any suitable moving mechanism 234 (shown dotted), which can be a suitable mechanism to carry out L motion of the gate 220, for example. Other suitable mechanisms for retracting and moving the gate out of alignment with the opening 225 may be used.

In the depicted embodiment, the wall 235 of the liner element 232 of the chamber 104 aligns with a frontal surface 228 the blocker element 224. In this manner, the peripheral profile of the chamber 104 is smooth, continuous and/or uninterrupted. Accordingly, a gas flow profile within the chamber 104 may be improved, thermal gradients within the chamber 104 may be improved (e.g., minimized), and deposition coating irregularities may be improved (i.e., coating thicknesses may become more uniform).

As shown in FIGS. 2A-2D, the opening 225 may include a radial recess 236 that is adapted to receive at least a portion of the blocker element 224 therein when the slit valve apparatus 107 is actuated to an opened configuration as shown in FIGS. 2B and 2C.

Another substrate processing system 300 is shown in FIG. 3. In this system 300, the slit valve apparatus 307 includes a gate 320 and a blocker element 324 connected by one or more connecting members 326. In this embodiment, the gate 320 seals by way of a periphery seal 322 that extends around the periphery of the gate 320 and seals against an outside surface adjacent to the opening 325 into the chamber 104 at the first location 327 and the blocking element 324 interfaces closely with an opening through the liner element 332, at the second location 331. In this embodiment, only a small motion (4-6 mm) in the lateral direction (towards the opening 325) is required before the gate 320 and the blocking element 324 may be retracted, and the blocking element 324 may be lowered into the recess 336 when the moving mechanism 334 retracts the slit valve apparatus 307 from the closed configuration shown to an opened configuration.

Figure 3A:
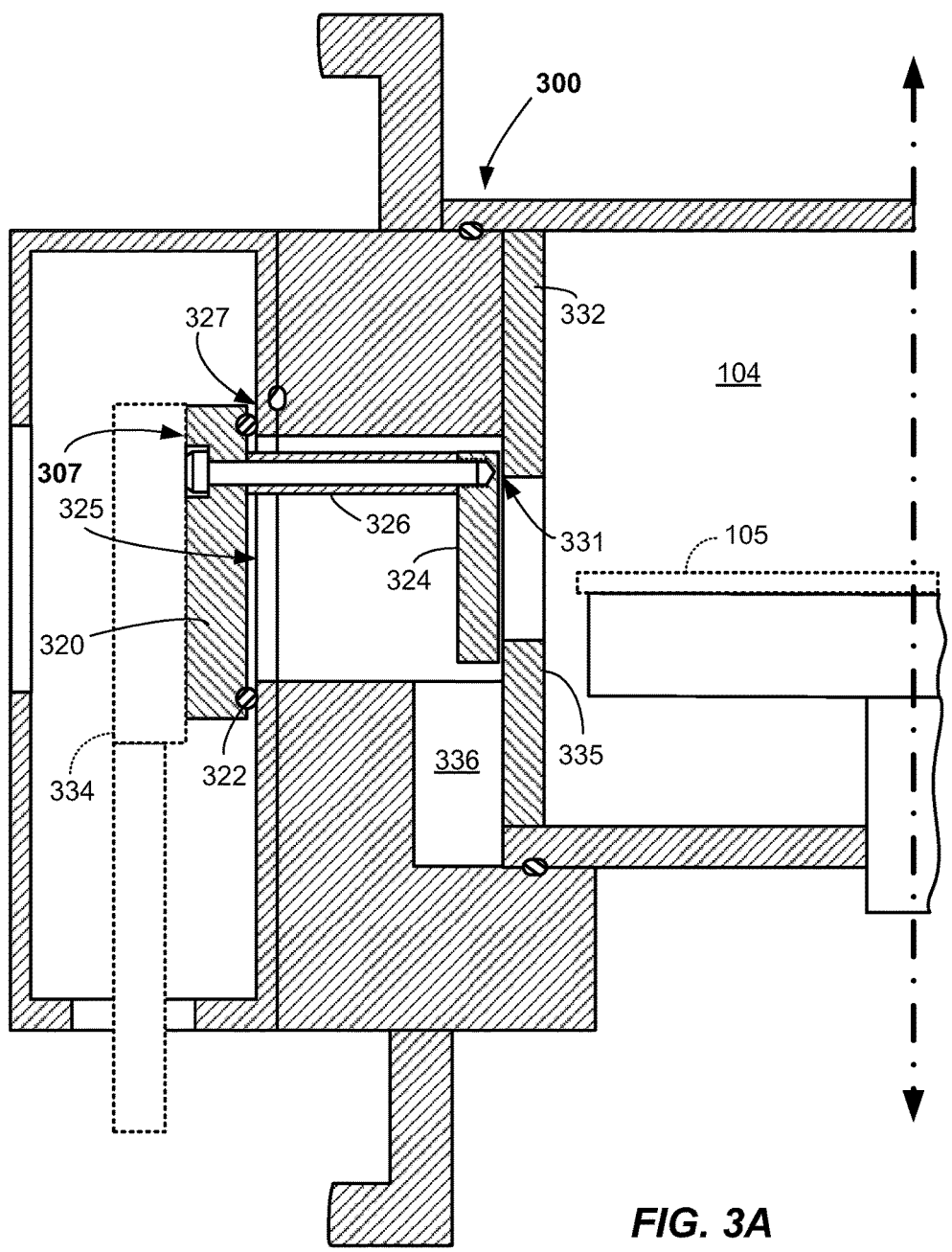
FIG. 3A is a cross-sectioned side view of an alternative embodiment of slit valve apparatus.
Figure 3B:
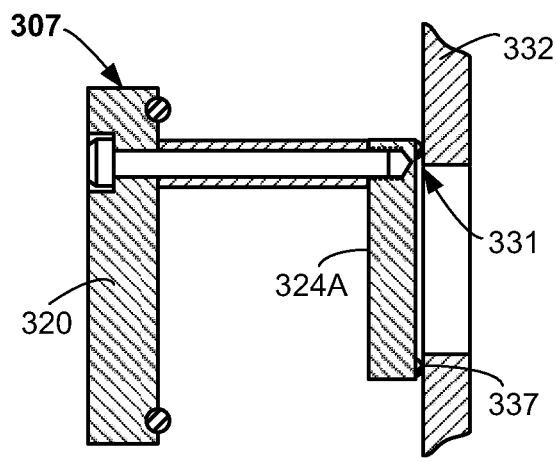
FIG. 3B is a cross-sectioned side view of an alternative embodiment of slit valve apparatus including metalized seals.
Figure 3D:
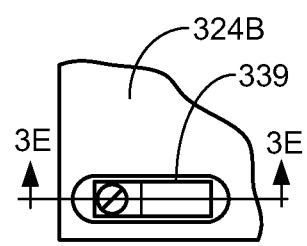
FIG. 3D is a partial front view of a blocker element of a slit valve apparatus including a conductive bridge element.
Figure 3C:
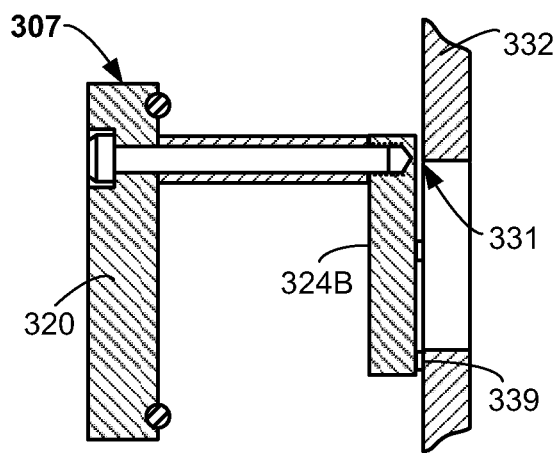
FIG. 3C is a cross-sectioned side view of an alternative embodiment of slit valve apparatus including conductive bridge elements.
Figure 3E:
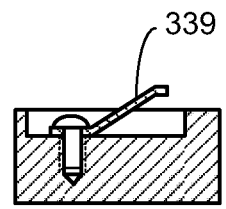
FIG. 3E is a partial cross-sectioned side view of a blocker element of a slit valve apparatus including a conductive bridge element taken along section line 3E-3E.

In some embodiments, such as in FIGS. 3B-3D, it may be desirable to allow the blocking element 324A, 324B to make electrical contact with the liner element 332 so that the conductive profile of the blocking element 324 will closely match that of the liner element 332. This may help provide a more uniform plasma profile when the chamber 104 is used for plasma deposition on the substrate 105. The conductive bridge may be accomplished by utilizing an electrically conductive bridge on the blocker element 324 such as a metalized seal 337 such as shown in FIG. 3A. The metalized seal 337 may include an electrically conductive surface thereon, such as by forming the seal of a conductive elastomer material. Optionally, discreet electrically conductive bridges, such as the low stiffness leaf springs 339 shown in FIG. 3D may be used. One or more of the conductive bridges 339 may be provided, such as around the edges of the blocker element 324B. In some embodiments, the electrically conductive bridges may comprise a wavy spring received in a recess formed around the periphery of the blocker element 324, wherein the wavy spring flattens out into the recess and contacts the liner element 332 at multiple locations.

Figure 4:
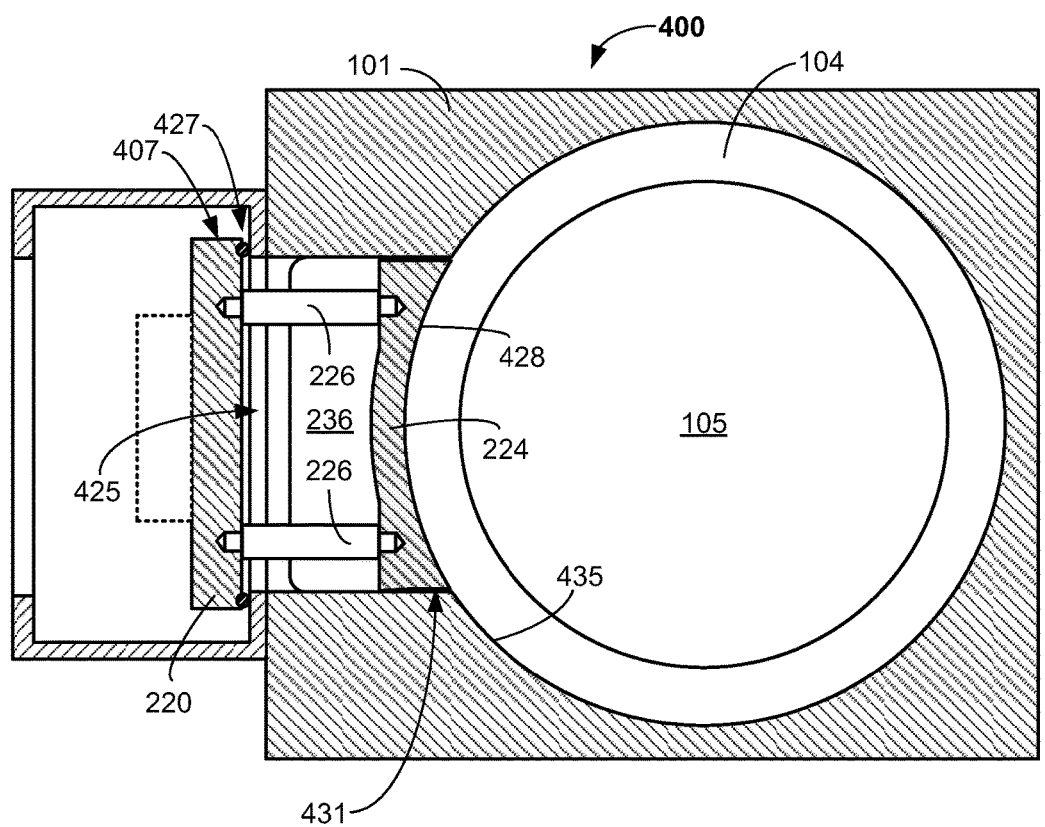
FIG. 4 is a cross-sectioned top view of an alternative embodiment of a slit valve apparatus.

In some system embodiments, such as the embodiment of substrate processing system 400 being shown in FIG. 4, the slit valve apparatus 407 interfaces closely with an opening into the chamber itself at the second location 431, rather than interfacing with a liner element (e.g., liner element 232) at the second location 231 as in the FIG. 2A-2D embodiment. The front surface 428 of the blocker door 224 may be closely aligned with the wall 435 of the chamber 104 when closed and exhibits a similar shape profile as the wall 435 such that a smooth, continuous and uniform surface profile of the chamber 104 is achieved.

Figure 5:
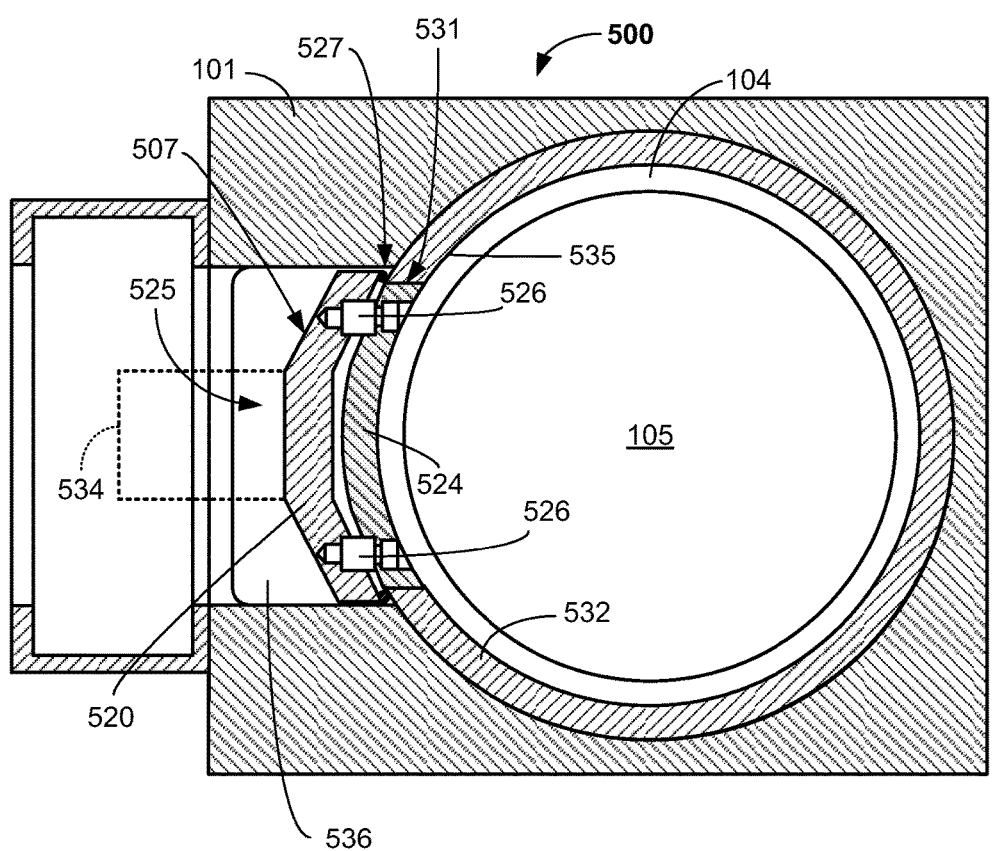
FIG. 5 is a cross-sectioned top view of another alternative embodiment of a slit valve apparatus.

Another substrate processing system 500 is shown in FIG. 5. In this system 500, the slit valve apparatus 507 includes a gate 520 and a blocker element 524 connected by one or more connecting members 526. In this embodiment, the gate 520 seals against the outside surface of the liner element 532 of the chamber 104 at the first location 527 and the blocking element 524 interfaces closely with an opening through the liner element 532, at the second location 531. In this embodiment, upon opening, both the gate 520 and the blocking element 524 move away from the liner, drop away, and are at least partially received in the recess 536 when the moving mechanism 534 retracts the slit valve apparatus 507 from the closed configuration shown in FIG. 5 to an opened configuration.

Figure 6A:
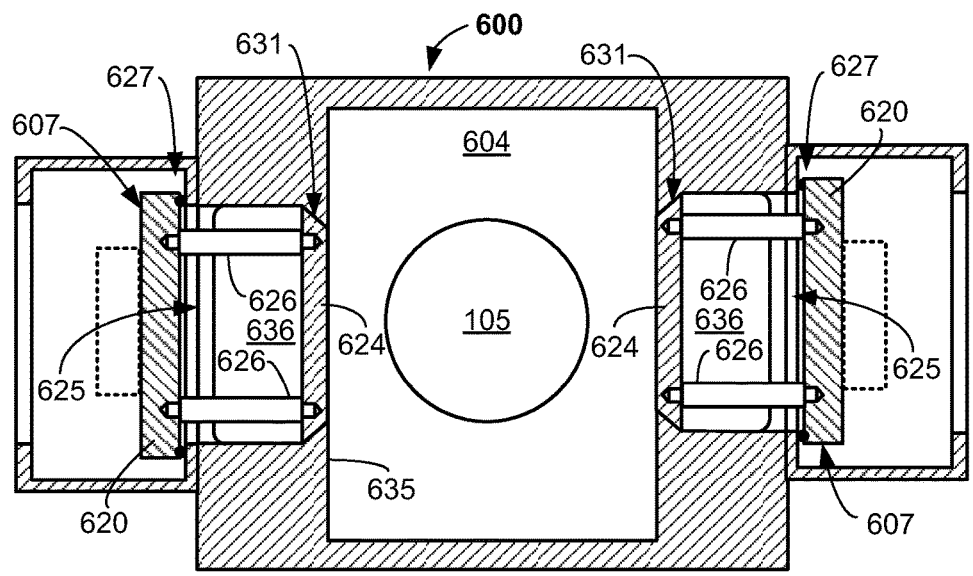
FIG. 6A is a cross-sectioned top view of system including a chamber with access through multiple slit valve apparatuses.
Figure 6B:
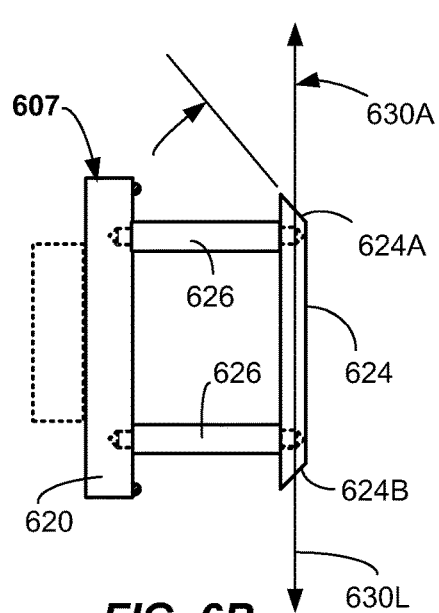
FIG. 6B is a top view of an embodiment of a slit valve apparatus having angle edges on the blocker element.
Figure 6C:
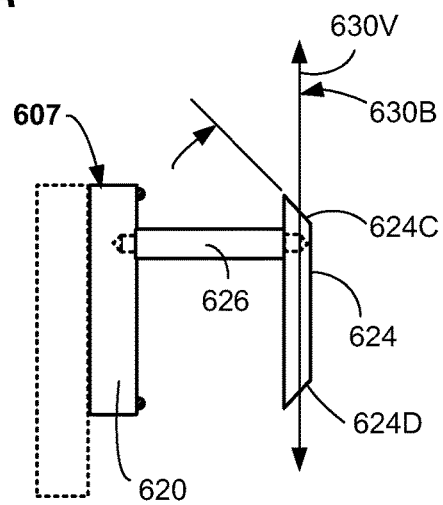
FIG. 6C is a side view of the embodiment of a slit valve apparatus of FIG. 6B.

In some embodiments, such as the embodiment of system 600 including slit valve apparatus 607 shown in FIG. 6A-6C, an edge surface on at least some peripheral edges of the blocker element 624 may include an angled interface surface 624A-624D, such as is shown in the top view of FIG. 6B, and side view of FIG. 6C. One or more, and preferably all, of the peripheral edges may include an angled interface surface 624A-624D that may be angled at an angle 630A, 630B of less than 90 degrees as measured from a longitudinal centerline 630 of the blocker element 624 in the direction of interest (relative to longitudinal axes 630L or 630V). The longitudinal centerline 630L, 630V passes through the physical center of the blocking element 624. In some embodiments, the angle 630A, 630B may between 25 and 65 degrees. The angles 630A, 630B may be the same or different. Other angles may be used. As shown, a slit valve apparatus 607 may be used on multiple entries or exits from the chamber 604, which may be a process chamber or load lock. The gate 620 and connector members 626 are as previously described herein.

Figure 7:
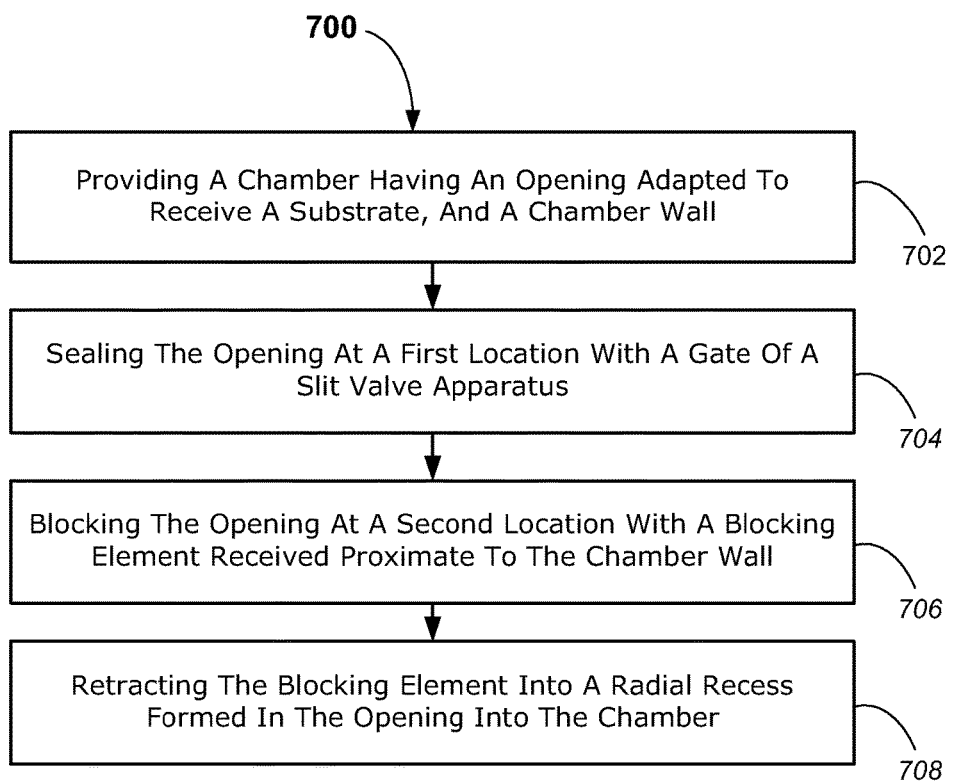
FIG. 7 is a flow chart depicting a method according to another embodiment.

A method 700 of transporting a substrate (e.g., 105) such as within an electronic device processing system (e.g., 200, 300, 400, 500, 600) according to the present invention is provided and described with reference to FIG. 7. The method 700 includes, in 702, providing a chamber (e.g., 104, 604) having an opening (e.g., 225) adapted to receive a substrate (e.g., 105), and a chamber wall (e.g., 235, 435). The method 700 further includes sealing the opening at a first location (e.g., 227, 337, 427, 527, 627) with a gate (e.g., 220, 320, 520, 620) of a slit valve apparatus (e.g., 107, 207, 307, 407, 507, 607) in 704, and blocking the opening (e.g., 225) at a second location (e.g., 231, 331, 431, 531, 631) with a blocking element (e.g., 224, 324, 524, 624) received proximate to the chamber wall (e.g., 235, 335, 435, 535, 635) in 706. After sealing, the method 700 may retract the blocking element (e.g., 224, 324, 524, 624) into a radial recess (e.g., 236, 336, 536, 636) formed in the opening (e.g., 225, 325, 425, 525, 625) into the chamber (e.g., 104, 604). In some embodiments, such as shown in FIG. 5, both the blocking element 524 and the gate 520 may be retracted into a radial recess 436.

The foregoing description discloses only example embodiments of the invention. Modifications of the above-disclosed apparatus, systems, and methods which fall within the scope of the invention will be readily apparent to those of ordinary skill in the art. Accordingly, while the present invention has been disclosed in connection with example embodiments thereof, it should be understood that other embodiments may fall within the spirit and scope of the invention, as defined by the following claims.

The invention claimed is:

1. A slit valve apparatus, comprising:
a housing including a side wall having an opening to a chamber through which substrates are passed, and a radial recess formed in the opening directly adjacent to the chamber;
a gate having at least one sealing surface on a first side configured to seal against the opening at a first location;
a blocker element spaced from the first side of the gate and configured to block the opening at a second location directly proximate the chamber when the slit valve apparatus is in a closed configuration, the second location being closer to the chamber than the first location, at least a portion of the blocker element received in the radial recess when the slit valve apparatus is in an opened configuration;
one or more connector members structurally connecting the first side of the gate to the blocker element, wherein the one or more connector members structurally connected to the blocker element are all located at positions offset in a vertical direction from a longitudinal centerline passing through a physical center of the blocker element; and
a moving mechanism coupled to the gate on other than the first side and adapted to carry out motion of the gate and the blocker element simultaneously from the closed configuration to the opened configuration and from the opened configuration to the closed configuration.

2. The slit valve apparatus of claim 1, wherein the one or more connector members comprise one or more rods and rigidly connect between the gate and the blocker element.

3. The slit valve apparatus of claim 1, wherein the one or more connector members rigidly connect between the gate and the blocker element comprise a cross sectional area that is less than 25% of a frontal area of a frontal surface of the blocker element.

4. The slit valve apparatus of claim 1, comprising a curved frontal surface on the blocker element.

5. The slit valve apparatus of claim 4, wherein the curved frontal surface on the blocker element includes a radius of curvature that substantially matches a radius of a chamber the blocker element is adapted to interface with.

6. The slit valve apparatus of claim 1, wherein an edge surface on at least some peripheral edges of the blocker element includes an angled interface surface angled at less than 90 degrees from a lateral longitudinal centerline of the blocker element.

7. The slit valve apparatus of claim 1, wherein the blocker element includes an electrically conductive bridge element.

8. An electronic device processing system, comprising:
a housing including a side wall having an opening through which substrates are passed, and a radial recess formed in the opening;
a chamber coupled to the opening, the opening including a first location and a second location spaced from the first location, the second location being closer to the chamber than the first location, and the radial recess being located directly adjacent to the chamber; and
a slit valve apparatus arranged to seal the opening at the first location, wherein the slit valve apparatus includes:
a gate having at least one sealing surface, on a first side, adapted to seal the opening at the first location,
a blocker element spaced from the first side of the gate and configured to block the opening at a second location directly proximate the chamber when the slit valve apparatus is in a closed configuration, at least a portion of the blocker element received in the radial recess of the opening when the slit valve apparatus is in an opened configuration,
one or more connector members structurally connecting the first side of the gate to the blocker element, wherein the one or more connector members structurally connected to the blocker element are all located at positions offset in a vertical direction from a longitudinal centerline passing through a physical center of the blocker element; and
a moving mechanism coupled to the gate on a side other than the first side and adapted to carry out motion of the gate and the blocker element simultaneously from the closed configuration to the opened configuration and from the opened configuration to the closed configuration.

9. The electronic device processing system of claim 8 wherein the blocker element interfaces with a liner element of the chamber.

10. The electronic device processing system of claim 9 wherein an inner surface of the liner element aligns with an inner surface of the blocker element.

11. The electronic device processing system of claim 8 wherein an edge surface on at least some peripheral edges of the blocker element includes an angled interface surface angled at less than 90 degrees from a longitudinal centerline of the blocker element.

12. The slit valve apparatus of claim 1, wherein the one or more connector members structurally connected to the blocker element are offset from the longitudinal centerline passing through a physical center of the blocker element in a vertical direction that is opposite to the direction of movement of the blocker element when being received in the radial recess.

13. The electronic device processing system of claim 8, wherein the one or more connector members structurally connected to the blocker element are offset from the longitudinal centerline passing through a physical center of the blocker element in a vertical direction that is opposite to the direction of movement of the blocker element when being received in the radial recess.

* * * * *